(12) United States Patent
Teterwak

(10) Patent No.: US 6,587,098 B2
(45) Date of Patent: Jul. 1, 2003

(54) HIGH VOLTAGE CRYSTAL CONTROLLED OSCILLATOR FOR AN ELECTRONIC PEN USED WITH AN ELECTROSTATIC DIGITIZING TABLET

(75) Inventor: Jerzy A. Teterwak, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/911,209

(22) Filed: Jul. 23, 2001

(65) Prior Publication Data

US 2001/0055005 A1 Dec. 27, 2001

Related U.S. Application Data

(63) Continuation of application No. 08/866,582, filed on May 30, 1997, now abandoned.

(51) Int. Cl.$^7$ ................................................. G09G 5/00
(52) U.S. Cl. ..................................... 345/173; 178/18.01
(58) Field of Search ................................. 345/173, 177; 178/18.01, 18.02, 18.03

(56) References Cited

U.S. PATENT DOCUMENTS

| | | | | |
|---|---|---|---|---|
| 4,727,339 A | * | 2/1988 | Doty, II et al. | 331/173 |
| 5,073,849 A | * | 12/1991 | Morris | 363/21 |
| 5,745,013 A | * | 4/1998 | Hohmann | 331/179 |
| 6,271,651 B1 | * | 8/2001 | Stratakos et al. | 323/282 |

* cited by examiner

Primary Examiner—Richard Hjerpe
Assistant Examiner—Ronald Laneau
(74) Attorney, Agent, or Firm—Carstens, Yee & Cahoon, L.L.P.

(57) ABSTRACT

A high Q tank circuit is employed at the output of a digital, crystal controlled oscillator to generate a high voltage amplitude signal. The tank circuit has a resonant frequency greater than the maximum required oscillation frequency. During each oscillation cycle, oscillation within the tank circuit is stopped in an energy efficient manner such that the resonant oscillation period is extended to match the required oscillation period. Modulation of the digital oscillator signal appears in the output circuit signal.

14 Claims, 5 Drawing Sheets

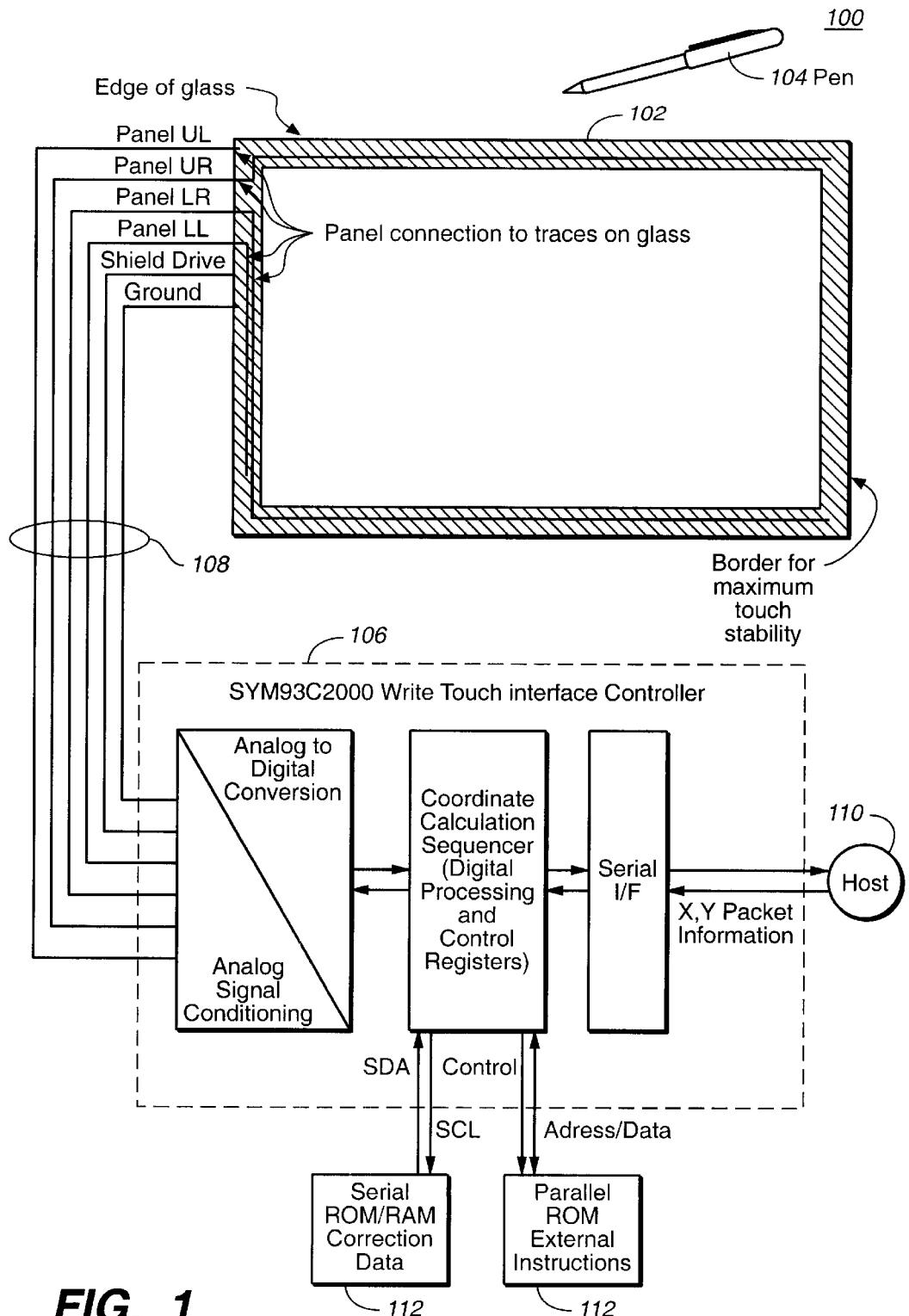
FIG._1

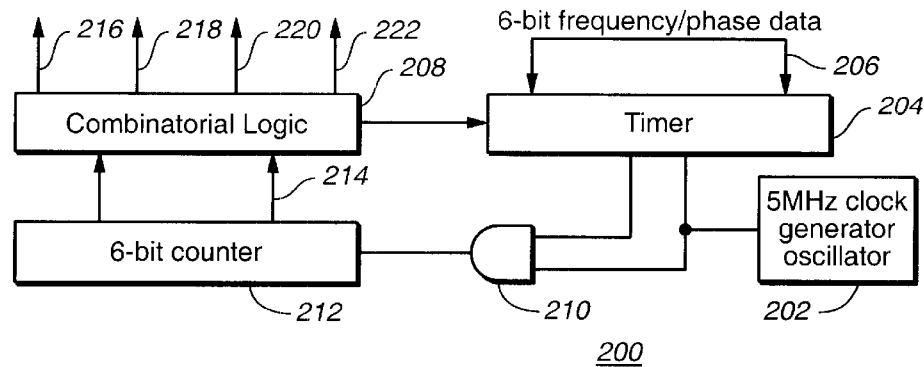
FIG._2
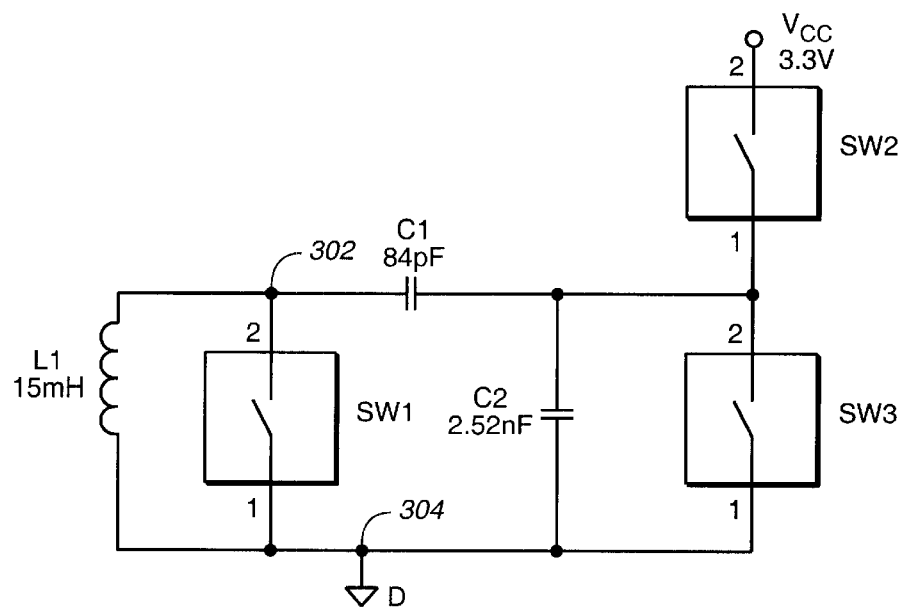
FIG._3
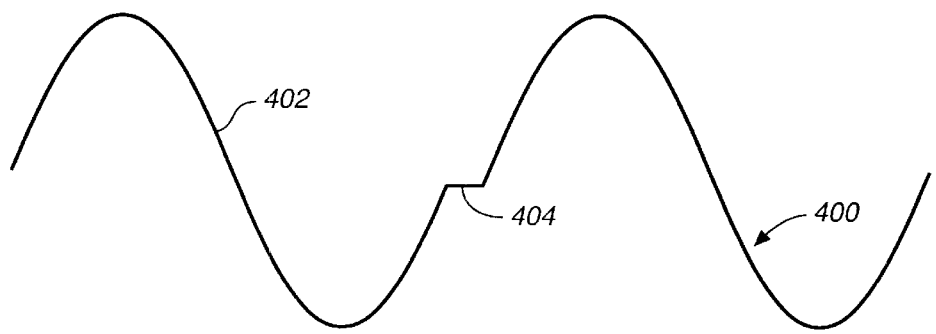
FIG._4

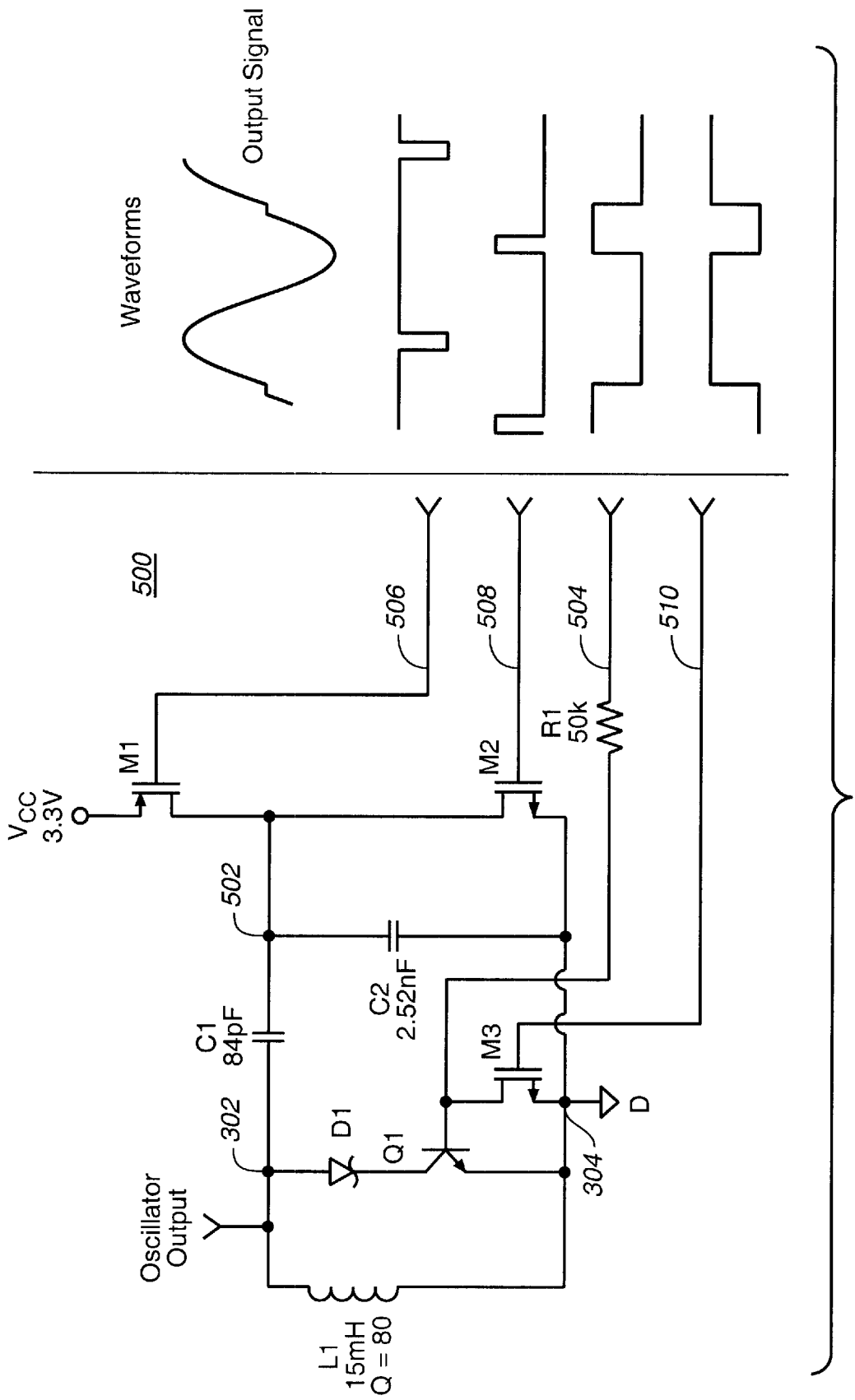
FIG._5A

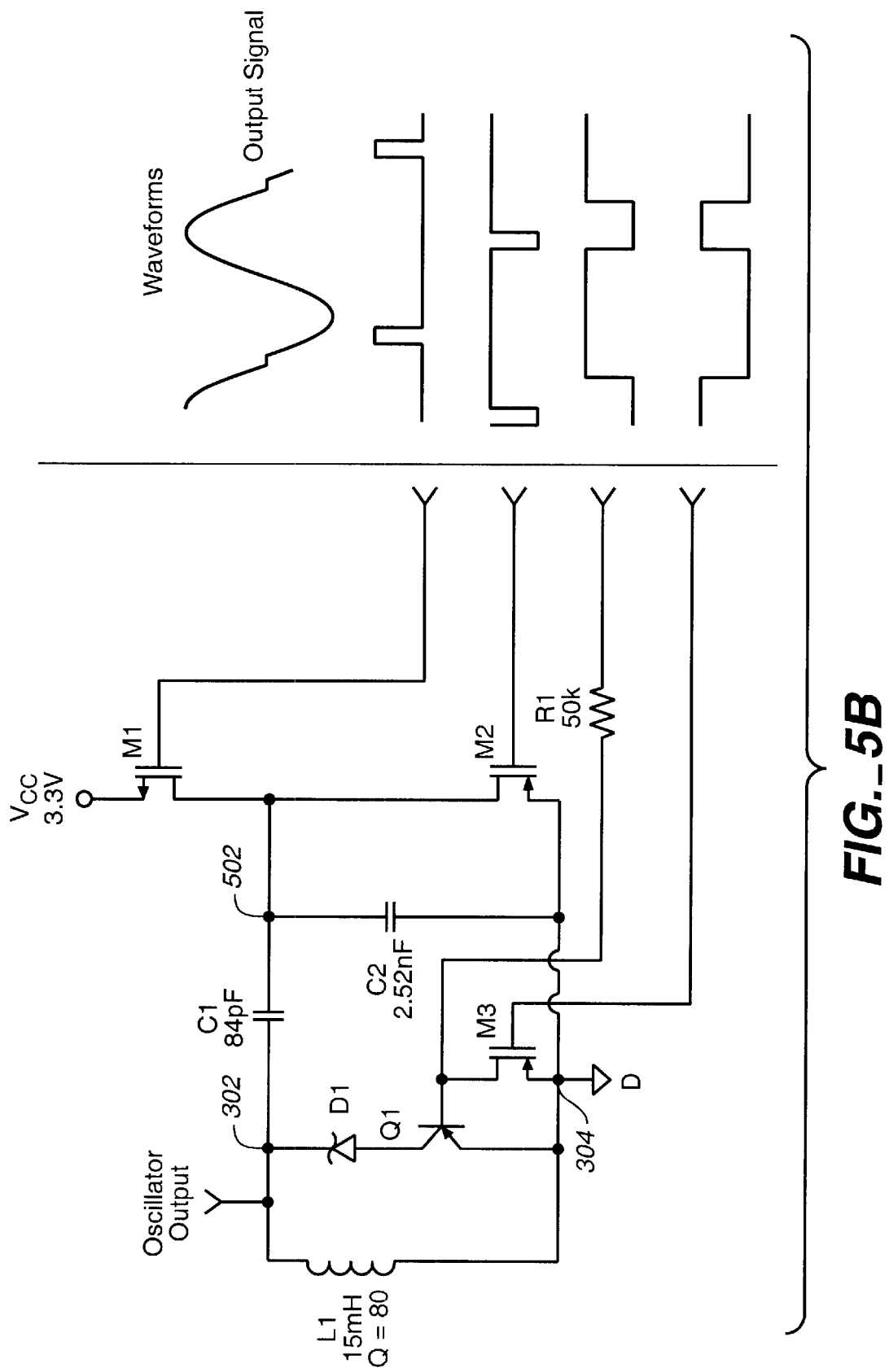
FIG._5B

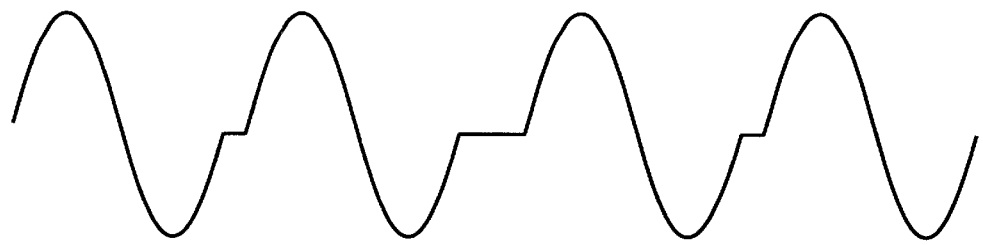
PHASE LAG
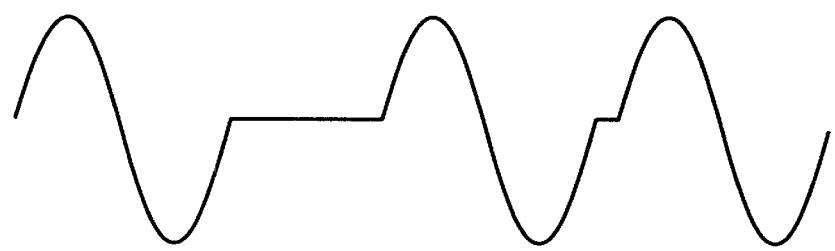
PHASE LEAD
A) PSK MODULATION
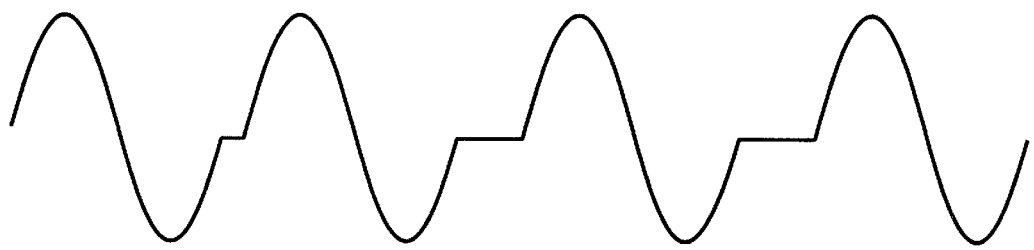
B) FSK MODULATION
*FIG._6*

HIGH VOLTAGE CRYSTAL CONTROLLED OSCILLATOR FOR AN ELECTRONIC PEN USED WITH AN ELECTROSTATIC DIGITIZING TABLET

This application is a continuation of U.S. application Ser. No. 08/866,582 filed May 30, 1997, now abandoned.

BACKGROUND OF THE INVENTION

1. Technical Field

The present invention relates generally to electronic pens used with an electrostatic digitizing tablet and in particular to battery powered electronic pens. Still more particularly, the present invention relates to an energy efficient high voltage oscillator for battery powered electronic pens used with an electrostatic digitizing tablet.

2. Description of the Related Art

Electrostatic digitizer tablets provide an indication of the location of an electronic pen on a planar sensor grid. The electronic pen (sometimes called a stylus) transmits an electric field by emitting a radio frequency (RF) signal which may be modulated. An oscillator within the pen provides the RF signal.

The electronic pen may be physically coupled to the tablet through wiring (generally referred to as a "tethered" pen) which provides power to the pen. Alternatively, the pen may be battery powered and unconnected to the tablet ("untethered"). Untethered pens provide a more natural user interface and are therefore preferable.

Within a battery powered electronic pen, the oscillator consumes the most power. The oscillator is typically a high output voltage oscillator, generated output voltages in the range of 80–100 Vp-p (volts peak-to-peak). Since the pen is powered by a small, watch-type battery, an extremely energy efficient oscillator is desirable. On the other hand, the operating frequency of the oscillator should be well-defined and stable. Satisfying both requirements for an electronic pen oscillator design is quite challenging. Conventional electronic tuning methods may not be employed because the high voltage amplitude prevents the use of available tuning components such as varicaps or varactors.

Given a power supply limited to 3–5 V, a high Q tank circuit at the output of the oscillator is the most energy efficient mechanism for obtaining the high output voltage required. However, a tank circuit generally yields an operating frequency tolerance of 5–10%, which may be unacceptable for many applications. Automatic electronic tuning of the tank circuit—with a phase lock loop (PLL), for example—is virtually impossible for circuit oscillation amplitudes in the range of 80–100 Vp-p.

Additionally, the high voltage pen output signal usually requires additional modulation to transmit pen status information. Such information, called telemetry, may typically include tip switch status, barrel switch status, battery status, etc. Efficient output signal modulation of a high Q tank circuit with a voltage amplitude swing of 100 Vp-p at the oscillator output is difficult.

It would be desirable, therefore, to provide an energy efficient oscillator having a very stable and very well defined operating frequency which produces an output voltage in the range of at least 80 Vp-p. It would further be desirable to provide an oscillator output circuit which permits efficient phase shift keyed (PSK) or frequency shift keyed (FSK) modulation of a high voltage output signal.

SUMMARY OF THE INVENTION

A high Q tank circuit is employed at the output of a digital, crystal controlled oscillator to generate a high voltage amplitude signal. The tank circuit has a resonant frequency greater than the maximum required oscillation frequency. During each oscillation cycle, oscillation within the tank circuit is stopped in an energy efficient manner such that the resonant oscillation period is extended to match the required oscillation period. Modulation of the digital oscillator signal appears in the output circuit signal.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 depicts a digitizer system for a data processing system in which a preferred embodiment of the present invention may be implemented;

FIG. 2 is a block diagram of digital controller for an oscillator output circuit in accordance with a preferred embodiment of the present invention;

FIG. 3 depicts a simplified circuit diagram of an oscillator output circuit in accordance with a preferred embodiment of the present invention;

FIG. 4 is a pictorial representation of the output signal from an oscillator output circuit in accordance with a preferred embodiment of the present invention;

FIGS. 5A and 5B depict circuit diagrams of practical oscillator output circuit designs in accordance with a preferred embodiment of the present invention, together with input signals for controlling the circuit and the resulting output signal; and FIG. 6 is a series of pictorial representations of the output signal from an oscillator output circuit employing phase or frequency shifting in accordance with a preferred embodiment of the present invention.

DETAILED DESCRIPTION

With reference now to the figures, and in particular with reference to FIG. 1, a digitizer system for a data processing system in which a preferred embodiment of the present invention may be implemented is depicted. Digitizer system 100 includes a digitizer tablet 102 detecting input from a pen 104 and transmitting signals to controller 106 via signal lines 108. Controller 106 is connected to a host data processing system 110, and may also be connected to additional memory devices 112.

Referring to FIG. 2, a block diagram of digital controller for an oscillator output circuit in accordance with a preferred embodiment of the present invention is illustrated. Controller circuit 200 is implemented within pen 104 depicted in FIG. 1. Controller circuit 200 includes an oscillator 202, which is a 5 MHz clock generator in the exemplary embodiment. Oscillator 202 is connected to a timer 204, which receives frequency and phase data from the pen output via signals 206 and a signal from combinatorial logic 208. An output signal from timer 204 is combined with the output of oscillator 202 in AND gate 210. The output of AND gate 210 enables counter 212, which is a 6-bit counter counting up to 39 with each cycle of oscillator 202 and then cycling back to 0. Combinatorial logic 208 generates control signals 216–222 based on output signals 214 of counter 212.

With reference now to FIG. 3, a simplified circuit diagram of an oscillator output circuit in accordance with a preferred embodiment of the present invention is depicted. The oscillator output circuit depicted is implemented within pen 104 depicted in FIG. 1. The oscillator output circuit 300 includes a high Q—in the range of 100—tank circuit (or resonance circuit) including capacitors C1 and C2 and an inductor L1. Oscillator output circuit 300 is employed at the output of a crystal controlled digital oscillator (not shown). Inductor L1 is connected between an output node 302 and ground 304. Capacitors C1 and C2 are connected in series between output node 302 and ground 304, in parallel with inductor L1. Inductor L1 and capacitors C1 and C2 form an LC resonance circuit or tank circuit with an output taken at node 302.

Simple connection of a tank circuit to the output of an oscillator will not give good results. Since it is virtually impossible to perfectly match the resonance frequency of the tank circuit with the output frequency of the oscillator, the tank circuit's resonant frequency will always differ slightly from the digital oscillator operating frequency. As a result, the tank circuit, being out of tune, will not produce a high output voltage.

To overcome this problem, a tank circuit having a resonant frequency slightly higher than the digital oscillator operating frequency is utilized. During each period, oscillation of the tank circuit is stopped for the length of time required to make the overall period of the tank circuit oscillation exactly equal to the operating period of the digital oscillator. The tank circuit oscillation may be stopped with virtually no energy loss by shorting the inductor when the capacitor voltage crosses zero level. Thus, the tank circuit oscillation is suspended when all of the energy of the circuit is accumulated in the inductor.

In order to short inductor L1, a switch SW1 is shunted across inductor L1, from output node 302 to ground 304. Switch SW1 allows the beginning of the oscillation period in the tank circuit (and thus of the output signal) to be correlated with the beginning of the oscillation period of the digital oscillator. At the beginning of an oscillation period, switch SW1 is closed and oscillation in the tank circuit is suspended with all of the tank circuit energy is accumulated in inductor L1. Switch SW1 opens, causing the LC tank circuit to resume oscillation.

After a single period of oscillation in the tank circuit, when voltages in capacitors C1 and C2 cross the zero level, switch SW1 closes again. Oscillation within the tank circuit is again suspended until the oscillation period of the digital oscillator completes. The tank circuit energy remains accumulated in inductor L1 while oscillation in the tank circuit is suspended, until the remainder of the digital oscillator period elapses.

Ideally, if the inductor has infinite Q and the short is ideal, the inductor current would remain constant and energy would be conserved. In real circuits, however, energy losses will be caused by inductor and switch imperfections. Energy must be supplied to the tank circuit to compensate for these losses. The manner in which the tank circuit is excited to replace this energy is important for the oscillator energy efficiency. The maximum efficiency may be achieved when very narrow pulses of high current are injected into the circuit when the capacitor voltages reach maximum and minimum.

Switches SW2 and SW3 are employed to inject two current pulses into capacitor C2. When the output voltage at output node 302 reaches maximum, switch SW2 closes for a short time, allowing current to be drawn from power supply $V_{CC}$. Similarly, when the output voltage at node 302 reaches minimum, switch SW3 closes for a short period of time, permitting current to pass to ground 304.

Referring to FIG. 4, a pictorial representation of the output signal from an oscillator output circuit in accordance with a preferred embodiment of the present invention is depicted. The oscillator output signal 400 is not ideally sinusoidal. Instead, the output signal 400 consists of a sinusoid 402 for the resonant period of the tank circuit followed by a small "shelf" 404 of a zero voltage output. The distortion does not represent any problem for this oscillator application. Such pen harmonic distortions do not affect the accuracy of the pen position determination.

With reference now to FIG. 5A, a circuit diagram of a practical oscillator output circuit design in accordance with a preferred embodiment of the present invention, together with input signals for controlling the circuit and the resulting output signals, is depicted. Output circuit 500, an implementation of circuit 300 depicted in FIG. 3, may be formed within a CMOS integrated circuit with an external bipolar transistor and Schottky diode.

Output circuit 500 includes inductor L1, a 15 mH inductor with Q=80 in the depicted example, connected between an output node 302 and ground 304. Capacitors C1 and C2, 84 pF and 2.52 nF, respectively, in the depicted example, are connected in series between output node 302 and ground 304, in parallel with inductor L1. Inductor L1 and capacitors C1 and C2 form a tank circuit.

A Schottky diode D1, a bipolar junction transistor Q1, and a field effect transistor M3 are connected in parallel with inductor L1. Diode D1 is connected at the anode to output node 302 and at the cathode to the collector of transistor Q1. The emitter of transistor Q1 and the source of transistor M3 are connected to ground 304. The drain of transistor M3 is connected to the base of transistor Q1. Transistor M3 is an n channel device in the depicted example.

Field effect transistor M1 is connected between a power supply $V_{CC}$ and the junction between capacitors C1 and C2. The source of transistor M1, a p channel device in the depicted example, is connected to power supply $V_{CC}$ while the drain is connected to node 302 between capacitors C1 and C2. Field effect transistor M2, an n channel device in the depicted example, is connected in parallel with capacitor C2, between node 502 and ground 304.

An input 504 is connected to the base of transistor Q1 via a resistor R1. Inputs 506, 508 and 510 are connected to the gates of transistors M1, M2, and M3, respectively. Signals applied to inputs 504–510 control operation of output circuit 500.

Transistor Q1 operates in saturation and, just prior to the beginning of an oscillation period, shorts inductor L1 through diode D1. A digital signal applied to input 504 switches to the zero level at the beginning of the oscillation period, opening transistor Q1 and causing the LC tank circuit to resume oscillating. In the depicted example, the output voltage at output node 302 is positive in the first half of the oscillation cycle after transistor Q1 and negative in the second half. During the second half of the cycle, transistor Q1 is again turned on by the signal at input 504 going high.

After being turned on, transistor Q1 has no immediate effect since it is blocked by the negative output voltage across diode D1. When the output voltage at output node 302 crosses the zero level, at the end of the tank circuit resonance period but before the end of the oscillation period for the digital oscillator, diode D1 begins to conduct and inductor L1 is shorted through diode D1 and transistor Q1. Output circuit 500 remains in this state until 8 μs has elapsed since the beginning of the oscillation period, giving output circuit 500 an operating frequency of 125 KHz.

A signal applied to input 510, which is the inverse of the signal applied to input 504, turns on transistor M3 when transistor Q1 is open. This prevents transistor Q1 from being turned on by current feeding through the transistor's collector-base capacitance.

Transistors M1 and M2, controlled by signals applied at inputs 506 and 508, respectively, serve as switches injecting short pulses of current into the tank circuit. Transistor M1 injects a current pulse when the output voltage reaches its maximum, and transistor M2 injects a current pulse when the output voltage reaches its minimum.

In operation, transistors M1 and M2 are turned on for a short period of time by voltage pulses applied at inputs 506 and 508. The pulses are generated by a digital controller (not shown) and have a duration of 200 ns in the exemplary embodiment. When turned on, transistors M1 and M2 represent a resistance $R_{on}$. The time constant $R_{on}C2$ should be less than one third of the width of the pulses. For 200 ns pulses, the time constant should be less than 66 ns, which means that for C2=2.52 nF, $R_{on}$ must be less than 26 ohms.

Output circuit 500 produces an 80 Vp-p output signal from a 3.3 V power supply. Output circuit 500 consumes only 250 μA of power supply current, not including current drawn by the control circuit for generating the signals applied to inputs 504–510.

Referring again to FIG. 2, the control signals at inputs 504–510 of output circuit 500 are provided by outputs 216–222 of combinatorial logic 208. The appropriate signals may be generated by combinatorial logic 208 by selecting bits within the output of counter 212, which is incremented by cycles of oscillator 202 which pass through AND gate 210. When the oscillator output circuit completes a resonant oscillation period, timer 204 blocks the signal of oscillator 202 from passing through AND gate 210. By changing timer 204, the effective oscillation period of the pen output signal may be controlled.

With reference to FIG. 5B, a circuit diagram of an alternative oscillator output circuit design in accordance with a preferred embodiment of the present invention, together with input signals for controlling the circuit and the resulting output signals, is depicted. The design is similar to that depicted in FIG. 5A, except: the source of transistor M1 is connected to a negative power supply $V_{EE}$; bipolar transistor Q1 is a PNP transistor; transistor M1 is an n channel device while transistors M2 and M3 are p channel devices; and diode D1 is connected at the cathode to output node 302 and at the anode to the collector of transistor Q1. The control signals are inverted from the embodiment depicted in FIG. 5A, as is the oscillator output signal.

Referring to FIG. 6, pictorial representations of the output signal from an oscillator output circuit employing phase or frequency shifting in accordance with a preferred embodiment of the present invention are illustrated. Examples of phase lag and phase lead PSK modulation and FSK modulation are provided. The required phase or frequency modulation is performed in the digital oscillator initiating the tank circuit oscillation period.

Simple connection of a tank circuit to a digital oscillator would not be satifactory since the tank circuit would not be able to effectively track the shifting phase or frequency of the digital oscillator. However, the output circuit of the present invention employs a tank circuit having a resonant frequency slightly higher than the maximum frequency of the digital oscillator. Oscillation within the tank circuit is stopped briefly during each oscillation period of the digital oscillator for the time required to make the overall period of the tank circuit exactly equal the current (instantaneous) period of the digital oscillator. Phase or frequency modulation performed in the digital oscillator by method known in the art produces corresponding phase or frequency modulation in the output circuit.

In PSK modulation, when a step phase lead is required which requires generation of a fraction of the resonant period in the tank circuit, oscillation in the tank circuit is stopped for the time equivalent to $2\pi-\Delta\phi$, effectively providing the required $\Delta\phi$ phase lead. No timing circuits are required since oscillation within the output circuit is initiated by the zero-level crossing of the digital oscillator output at the start of an oscillation period.

Phase lag PSK modulation and FSK modulation have the same effect. Output circuit oscillation started by the zero-level crossing of the digital oscillator signal, beginning oscillation when the diode becomes forward biased. The output circuit thus tracks adjustments to the digital oscillator signal.

The present invention precisely controls the frequency of an LC tank circuit by shorting the inductor when the voltage across the circuit crosses the zero level at the end of a resonant oscillation period. The circuit is kept in this state until the required oscillation period has elapsed, then oscillation is resumed. This approach is very energy efficient since the current in the shorted inductor remains almost constant, preserving energy accummulated in the circuit. The tank circuit may thus be employed at the output of a digital, crystal controlled oscillator to step up the signal to an 80–100 Vp-p level, where conventional electronic tuning methods may not be employed.

The frequency or phase of the LC tank circuit may also be modulated by shorting the inductor when the voltage across the circuit crosses the zero level and keeping the circuit in that state until the required instantaneous oscillation period is reached. This permits effective PSK or FSK modulation to a high voltage oscillator.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. An oscillator output circuit, comprising:
a tank circuit receiving a digital oscillator signal having a signal period, the tank circuit oscillating with a resonant period which is less than the signal period; and
a switch halting oscillation within the tank circuit for an interval equal to the difference between the signal period and the resonant period, wherein the oscillator output circuit may efficiently provide a high voltage amplitude signal,
the tank circuit further including an inductor and at least one capacitor connected in parallel, wherein the switch shorts the inductor when a voltage across the at least one capacitor is zero, and
the switch further includes:
a diode connected to a first terminal of the inductor; and a bipolar junction transistor connected at an emitter to a second terminal of the inductor, at a collector to a cathode of the diode, and at a base to an input receiving a signal from the digital oscillator.

2. An oscillator circuit, comprising:
a tank circuit connected between an output node and a ground, the tank circuit oscillating for a resonant period during an oscillation cycle; and
a switch connected to the tank circuit, the switch suspending oscillation in the tank circuit for an interval equal to the difference between the resonant period and a predetermined period,
wherein the tank circuit further includes:
an inductor connected at a first terminal to the output node and at a second terminal to the ground; and
at least one capacitor connected at a first terminal to the ground, and
wherein the switch further includes:
diode connected at an anode to the first inductor terminal; and
a bipolar junction transistor connected at an emitter to the second inductor terminal, at a collector to a cathode of the diode, and at a base to an input receiving a control signal.

3. An oscillator output circuit, comprising:
a tank circuit receiving a digital oscillator signal having a signal period, the tank circuit oscillating with a resonant period which is less than the signal period;
a switch halting oscillation within the tank circuit for an interval equal to the difference between the signal period and the resonant period, wherein the oscillator output circuit may efficiently provide a high voltage amplitude signal, wherein the switch comprises:
a diode connected to a first terminal of the inductor;
a bipolar junction transistor connected at an emitter to a second terminal of the inductor, at a collector to a cathode of the diode, and at a base to an input receiving-a-signal from the digital oscillator;
a field effect transistor connected at a source to the second terminal of the inductor, at a drain to the base of the bipolar junction transistor, and at a gate to an input receiving an inverted signal from the digital oscillator;
wherein the tank circuit comprises an inductor and at least one capacitor connected in parallel; and
wherein the switch shorts the inductor when a voltage across the at least one capacitor is zero.

4. An oscillator output circuit, comprising:
a tank circuit receiving a digital oscillator signal having a signal period, the tank circuit oscillating with a resonant period which is less than the signal period, wherein the tank circuit comprises an inductor and at Least one capacitor connected in parallel;
a switch halting oscillation within the tank circuit for an interval equal to the difference between the signal period and the resonant period, wherein the oscillator output circuit may efficiently provide a high voltage amplitude signal, wherein the switch shorts the inductor when a voltage across the at least one capacitor is zero;
a second switch connecting the at least one capacitor to a power supply voltage when a voltage across the at least one capacitor is at a maximum; and
a third switch connecting the at least one capacitor to a ground when the voltage across the at least on capacitor is at an opposite maximum.

5. A pen circuit for a digitizing system, comprising:
an inductor connected in parallel with at least one capacitors; wherein the at least one capacitor further comprises a first capacitor and a second capacitor connected in series, a connection node between the inductor and the first capacitor forming an output node, a connection node between the inductor and second capacitor connected to a ground;
a transistor connected in series with a diode, the transistor and the diode connected in parallel with the inductor and shorting the inductor when the transistor is on; and
a controller turning on the transistor to selectively short the inductor, wherein the inductor and the at least one capacitor form a tank circuit oscillating with a resonant period, the controller turning on the transistor at the end of an oscillation cycle until a desired period has elapsed.

6. The pen circuit of claim 5, wherein the transistor comprises a first transistor, the circuit further comprising:
a second transistor connecting a connection node between the first and second capacitors to a power supply voltage when on; and
a third transistor connecting the connection node between the first and second capacitors to the ground when on, the controller turning on the second and third transistors for selected periods during oscillation of the tank circuit to inject energy into the tank circuit.

7. The pen circuit of claim 6, wherein the controller turns on the second transistor for a brief period when a voltage across the second capacitor is at a maximum and turns on the third transistor for a similar brief period when a voltage across the second capacitor is at a minimum.

8. The pen circuit of claim 6, further comprising:
a fourth transistor connected to a base of the first transistor to ground when on, the controller turning on the fourth transistor when the first transistor is not on.

9. A data processing system, comprising:
a host processing system;
a digitizing tablet connected to the host processing system and receiving input signals from a pen, the digitizing tablet transmitting corresponding signals to the host processing system;
a pen containing an oscillator circuit generating an output signal detected by the digitizing tablet, the output signal comprising a sinusoidal oscillation portion and a nonsinusoidal portion, wherein the oscillator circuit includes:
an inductor connected at a first terminal to an output node for the output signal and at a second terminal to a ground node;
a first capacitor connected at a first terminal to the output node and at a second terminal to an input node;
a second capacitor connected at a first terminal to the input node and at a second terminal to the ground node;
a diode connected at a first terminal to the output node; and
a bipolar transistor connected at a collector to a second terminal of the diode and at an emitter to the ground node.

10. The data processing system of claim 9, wherein the oscillator circuit further comprises:
a first field effect transistor connected at a source to a power supply voltage and at a drain to the input node; and a second field effect transistor connected at a source to the ground node and at a drain to the input node.

11. The data processing system of claim 9, wherein the oscillator circuit further comprises:
a third field effect transistor connected at a source to the ground node and at a drain to a base of the bipolar transistor.

12. The data processing system of claim 11, wherein the pen further comprises:
a controller connected to the base of the bipolar transistor, the controller turning on the bipolar transistor at an end of the sinusoidal oscillation portion of the output signal for a duration of the nonsinusoidal portion of the output signal.

13. The data processing system of claim 12, wherein the controller is connected to a gate of the first field effect transistor and to a gate of the second field effect transistor, the controller turning on the first field effect transistor for a short period at a first peak of the sinusoidal oscillation portion of the output signal and turning on the second field effect transistor for a short period at a second peak of the sinusoidal oscillation period.

14. The data processing system of claim 12, wherein the controller is connected to a gate of the third field effect transistor, the controller turning on the third field effect transistor for a duration of the sinusoidal portion of the output signal.

* * * * *